(12) United States Patent
Bittner et al.

(10) Patent No.: US 9,817,316 B2
(45) Date of Patent: Nov. 14, 2017

(54) PROJECTION EXPOSURE METHOD AND PROJECTION EXPOSURE APPARATUS FOR MICROLITHOGRAPHY

(71) Applicant: Carl Zeiss SMT GmbH, Oberkochen (DE)

(72) Inventors: Boris Bittner, Roth (DE); Norbert Wabra, Werneck (DE); Martin von Hodenberg, Oberkochen (DE); Sonja Schneider, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/083,622

(22) Filed: Mar. 29, 2016

(65) Prior Publication Data

US 2016/0209754 A1     Jul. 21, 2016

Related U.S. Application Data

(63) Continuation of application No. PCT/EP2014/071096, filed on Oct. 1, 2014.

(30) Foreign Application Priority Data

Oct. 2, 2013 (DE) .................. 10 2013 219 986

(51) Int. Cl.
*G03F 7/20* (2006.01)

(52) U.S. Cl.
CPC .......... *G03F 7/70083* (2013.01); *G03F 7/706* (2013.01); *G03F 7/70258* (2013.01); *G03F 7/70525* (2013.01); *G03F 7/70891* (2013.01)

(58) Field of Classification Search
CPC ............. G03F 7/70083; G03F 7/70258; G03F 7/70525; G03F 7/706; G03F 7/70891
See application file for complete search history.

(56) References Cited

U.S. PATENT DOCUMENTS 6,650,399 B2   11/2003   Baselmans et al.
7,333,216 B2   2/2008   Wegmann et al.
(Continued)

FOREIGN PATENT DOCUMENTS

DE   10 2012 202 536 A1   8/2013
DE   10 2012 205 096 B3   8/2013
(Continued)

OTHER PUBLICATIONS

International Search Report and Written Opinion for corresponding PCT Appl No. PCT/EP2014/071096, dated Jan. 23, 2015.
(Continued)

*Primary Examiner* — Steven H Whitesell Gordon
(74) *Attorney, Agent, or Firm* — Fish & Richardson P.C.

(57) ABSTRACT

A projection exposure method for exposing a radiation-sensitive substrate with at least one image of a pattern includes providing the pattern between an illumination system and a projection lens of a projection exposure apparatus so that the pattern is arranged in the region of an object plane of the projection lens and can be imaged via the projection lens into an image plane of the projection lens. The image plane is optically conjugate with respect to the object plane, and imaging-relevant properties of the pattern can be characterized by pattern data. The method also includes illuminating an illumination region of the pattern with an illumination radiation provided by the illumination system in accordance with an illumination setting which is specific to a use case and which can be characterized by illumination setting data.

34 Claims, 7 Drawing Sheets

(56) References Cited

U.S. PATENT DOCUMENTS

| | | |
|---|---|---|
| 8,203,696 B2 | 6/2012 | Bittner et al. |
| 9,442,381 B2 | 9/2016 | Conradi et al. |
| 2007/0296938 A1* | 12/2007 | Tel .................... G03B 27/53 355/53 |
| 2011/0165522 A1* | 7/2011 | Mann ............... G02B 17/0657 430/325 |
| 2011/0235015 A1 | 9/2011 | Dengel et al. |
| 2013/0010272 A1 | 1/2013 | Gyoda et al. |
| 2013/0301024 A1 | 11/2013 | Conradi et al. |
| 2015/0029479 A1 | 1/2015 | Graeschus et al. |
| 2016/0033873 A1 | 2/2016 | Bittner et al. |
| 2016/0342097 A1 | 11/2016 | Conradi et al. |

FOREIGN PATENT DOCUMENTS

| | | |
|---|---|---|
| TW | 201235800 | 9/2012 |
| WO | WO 2004/019128 A2 | 3/2004 |
| WO | WO 2005/111689 A2 | 11/2005 |
| WO | WO 2009/100856 A1 | 8/2009 |
| WO | WO 2010/049020 A1 | 5/2010 |
| WO | WO 2012/097833 | 7/2012 |

OTHER PUBLICATIONS

Chinese Office Action and Search Report, with translation thereof, for corresponding Appl No. 2014800547971, dated Mar. 17, 2017.

\* cited by examiner

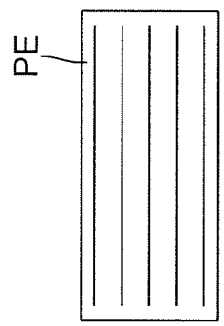
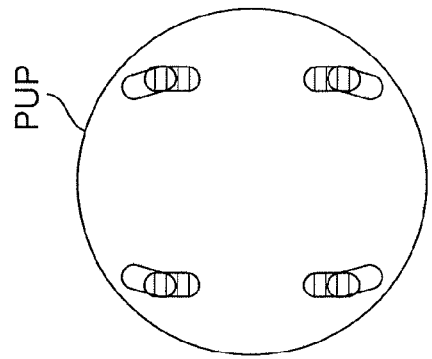
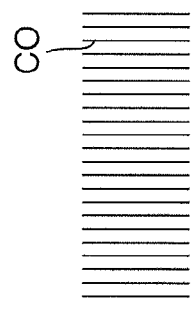
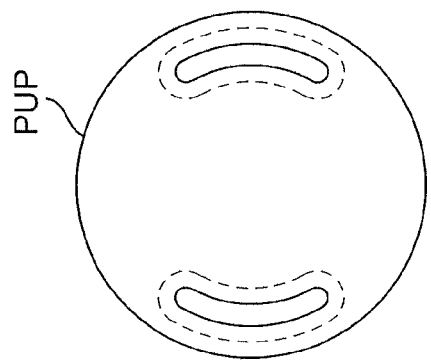
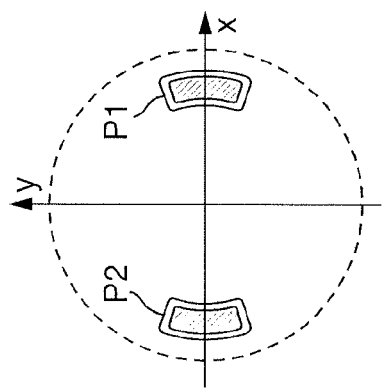

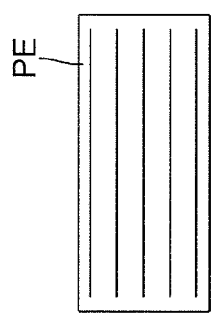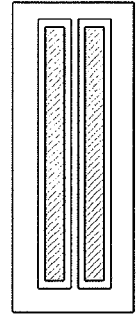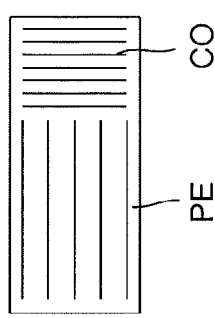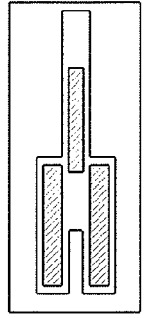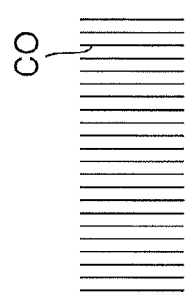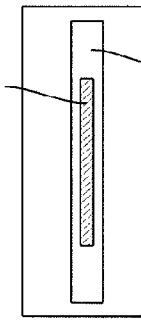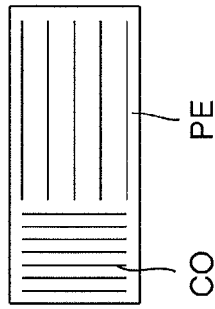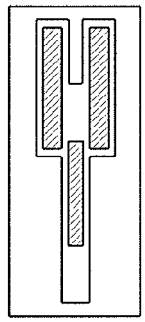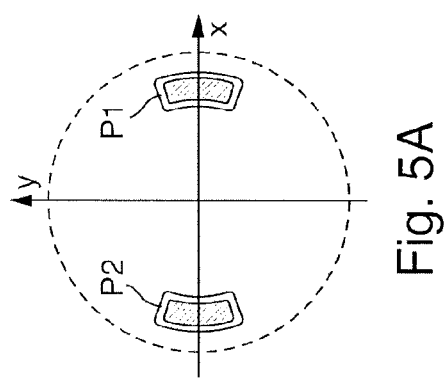

PROJECTION EXPOSURE METHOD AND PROJECTION EXPOSURE APPARATUS FOR MICROLITHOGRAPHY

CROSS-REFERENCE TO RELATED APPLICATIONS

The present application is a continuation of, and claims benefit under 35 USC 120 to, international application PCT/EP2014/071096, filed Oct. 1, 2014, which claims benefit under 35 USC 119 of German Application No. 10 2013 219 986.4, filed Oct. 2, 2013. The entire disclosure of international application PCT/EP2014/071096 and German Application No. 10 2013 219 986.4 are incorporated by reference herein.

FIELD

The disclosure relates to a projection exposure method for exposing a radiation-sensitive substrate with at least one image of a pattern, and to a projection exposure apparatus suitable for carrying out the method according.

BACKGROUND

Microlithographic projection exposure methods are predominantly used nowadays for producing semiconductor components and other finely structured components, e.g. masks (reticles) for microlithography. In this case, use is often made of masks (photomasks, reticles) which bear a specific pattern of a structure to be imaged, e.g. a line pattern of a layer of a semiconductor component. The pattern can also be provided with the aid of some other pattern unit, e.g. with the aid of a driveable pattern unit which can generate different patterns depending on the driving.

The pattern unit is positioned in a projection exposure apparatus in the beam path between an illumination system and a projection lens such that the pattern lies in the region of the object plane of the projection lens. A substrate to be exposed, for example a semiconductor wafer coated with a radiation-sensitive layer (resist, photoresist), is held in such a way that a radiation-sensitive surface of the substrate is arranged in the region of an image plane of the projection lens, the image plane being optically conjugate with respect to the object plane. During an exposure process, the pattern is illuminated with the aid of the illumination system, which shapes, from the radiation of a primary radiation source, an illumination radiation which is directed onto the pattern and which impinges on the pattern within an illumination field having a defined form and size. During an exposure process, the radiation altered by the pattern passes as projection radiation through the projection lens, which images the pattern onto the substrate to be exposed, which is coated with a radiation-sensitive layer.

The illumination radiation can be characterized by specific illumination parameters for each use case. Typically, this is referred to here as an illumination setting which is specific to a use case and which can be characterized by illumination setting data.

Some illumination systems for projection exposure apparatuses can be switched for example between conventional on-axis illumination with different degrees a of coherence and off-axis illumination. The off-axis illumination settings include for example annular illumination or a polar illumination, such as, for example, a dipole illumination, a quadrupole illumination or some other multipolar illumination. The selection of the optimum illumination setting for a use case is normally made by the end user of the projection exposure apparatus in a manner dependent on the pattern to be imaged and on other boundary conditions. The illumination setting data can contain specific parameters of such illumination settings.

The illumination setting is normally defined by the user for a specific process depending on the structure of the pattern to be imaged and other influencing factors, if appropriate, and is set on the illumination system. The imaging-relevant properties of the pattern can be characterized by pattern data.

The pattern data include e.g. information about what type of structures the pattern contains and how, if appropriate, different structures of a pattern (i.e. different partial patterns) are distributed locally in the pattern. A pattern can contain for example one or a plurality of regions with lines lying very close together, which can be imaged onto the substrate satisfactorily only if the projection lens has a correspondingly high resolution capability. Those regions having the smallest line spacing and/or the smallest periodicity length (pitch) of a group of mutually parallel lines are designated as core region in this application. The lines of the core region form the "core region structure". In order to be able to image such fine structures satisfactorily, conditions of two-beam interference are often employed by virtue of the fact that the illumination setting chosen is a dipole illumination in which the connecting line between the poles of the dipole illumination is oriented perpendicularly to the longitudinal direction of the lines to be imaged of the fine structures. Consequently, the orientation of the fine structures also plays an important part in the selection of a suitable illumination setting.

A pattern typically also contains regions with coarser structures that make less stringent desired properties of the imaging quality of the projection lens. By way of example, lines lying at a greater distance from one another can be provided, which form the feed lines to the finer structures in the finished substrate. Such structures that make less stringent desired properties of the imaging quality, in particular of the resolution capability of the projection lens, are also designated as "peripheral structures" in this application.

For the manufacturer of projection lenses the problem arises, inter alia, that it is not known what types of patterns will be used by an end user in the course of the overall use time of the projection lens for the production of structured components. This usually results in very hard specifications for the imaging quality of the projection lens in order that, if desired, even very fine structures or structures of any type can be imaged satisfactorily. The complexity and the costs for providing suitable universally useable projection lenses correspondingly increase to an extremely great extent as the requirements made of the imaging quality increase, e.g. by double patterning or quadruple patterning. The limits of the performance of the projection lenses are reached.

SUMMARY

The disclosure seeks to provide a projection exposure method which ensures a high quality of the structures produced on the substrate under different operating conditions. It is a further object of the disclosure to provide a projection exposure apparatus suitable for carrying out the projection exposure method.

In an aspect, the disclosure provides a projection exposure method for exposing a radiation-sensitive substrate with at least one image of a pattern. The method includes providing the pattern between an illumination system and a projection lens of a projection exposure apparatus in such a way that the pattern is arranged in the region of an object plane of the projection lens and can be imaged via the projection lens into an image plane of the projection lens. The image plane is optically conjugate with respect to the object plane, and imaging-relevant properties of the pattern can be characterized by pattern data. The method also includes illuminating an illumination region of the pattern with an illumination radiation provided by the illumination system in accordance with an illumination setting which is specific to a use case and which can be characterized by illumination setting data. The method further includes determining use case data which are specific to the use case and which include pattern data and/or illumination setting data, and determining imaging specification data using the use case data. In addition, the method includes controlling controllable optical components of the projection lens via a control unit of the projection lens in a manner dependent on the imaging specification data for the purpose of adapting the imaging behaviour of the projection lens to the use case, and imaging the pattern onto the substrate with the aid of the projection lens adapted to the use case.

In an aspect, the disclosure provides a projection exposure apparatus for exposing a radiation-sensitive substrate with at least one image of a pattern of a mask. The projection exposure apparatus includes an illumination system for receiving primary radiation of a primary radiation source and for generating an illumination radiation directed onto the mask. The projection exposure apparatus also includes a projection lens for generating an image of the pattern in the region of an image plane of the projection lens. The projection exposure apparatus further includes a mask holding unit for holding the mask between the illumination system and the projection lens in such a way that the pattern is arranged in the region of an object plane of the projection lens. In addition, the projection exposure apparatus includes a substrate holding unit for holding the substrate in such a way that a radiation-sensitive surface of the substrate is arranged in the region of the image plane of the projection lens. The image plane is optically conjugate with respect to the object plane. The projection exposure apparatus additional includes a system for adapting the imaging behaviour of the projection lens to a specific use case. The system includes units for determining use case data specific to the use case, units for determining imaging specification data using the use case data, and a control unit assigned to the projection lens and configured such that controllable optical components of the projection lens are controllable by the control unit in a manner dependent on the imaging specification data in order to adapt the imaging behaviour of the projection lens to the use case.

In the projection exposure method, system settings specific to the current use case are implemented which adapt the projection lens or the imaging behaviour thereof to specific characteristics of the pattern and special features of the illumination situation. For this purpose, firstly, use case data are determined which are specific to the use case envisaged by the user ("user case"). These use case data include pattern data and/or illumination setting data. Both pattern data and illumination setting data are preferably determined. Consequently, this method step acquires relevant information about the use case currently envisaged by the user, which information could not have been known, in the specific combination at any rate, during the original manufacture of the projection lens.

The use case data determined by the use case-related data acquisition are used to determine imaging specification data.

In this case, the term "imaging specification data" denotes data which are suitable for parameterizing an imaging behaviour of the projection lens that is specific to the use case, i.e. for describing the behaviour with the aid of suitable parameters. The imaging specification data can contain for example specification limit values for Zernike coefficients which describe specific aberrations relevant to the imaging. If, by way of example, the astigmatism is intended not to exceed a specific limit, then this can be expressed by a specification for the corresponding Zernike coefficient(s) Z5/Z6.

Since the imaging specification data are determined using the use case data, the imaging specification data can be optimized specifically for the use case under consideration. The imaging specification data determined can then be used to control controllable optical components of the projection lens with the aid of a control unit of the projection lens such that the imaging behaviour of the projection lens is adapted to the use case. An adaptation of the imaging behaviour of the projection lens to the specific use case thus takes place. The pattern can then be imaged onto the substrate with good imaging quality with the aid of the projection lens adapted to the use case.

This procedure is based on the following considerations, inter alia. It has been recognized that as requirements made of the projection lenses increase, an imaging-based assessment becomes more and more important. The imaging-based assessment involves assessing whether core region structures and/or peripheral region structures can be imaged with sufficient quality, i.e. whether a stable process window is present for producing an individual layer of the microchip. Quality criteria here include, for example, the variation of the line width and/or position of the line and/or the contrast.

It is assumed that the previous pragmatic procedure of optimizing the projection lens with regard to all important aberrations, trusting that as a consequence the imaging performance will then also be satisfactory, will be neither opportune nor sufficient in some cases. This is owing to the fact, inter alia, that depending on the use case the individual aberrations of the projection lens can make different contributions to the overall imaging performance. It is assumed that a conventional approach of optimizing all aberrations to such an extent that a satisfactory imaging behaviour results for all use cases will no longer be sufficient in all cases in the future owing to harder and harder specifications, on the one hand, and particularly aggressive illumination settings, on the other hand, and owing to the high throughput rates required. By way of example, it is feared that with extremely hard specifications that may be expected in the future for the so-called "overlay" in the context of double exposure methods, a projection lens not adapted to a specific use case will possibly no longer be able to fulfil the hard specifications. For a definition of the "overlay" reference should be made to U.S. Pat. No. 8,203,696 B2, column 21, line 36 to column 22, line 25.

The procedure in accordance with the claimed disclosure accepts that the optimization of the imaging behaviour of the projection lens to a specific use case may possibly also lead to a system state which does not necessarily yield sufficiently good imaging performance for a large number of other use cases. However, what is achieved by the claimed disclosure is that the imaging performance of the projection lens is adapted as well as possible to the use case currently present or the expected use case. In order to enable an optimization of the state of the projection lens to the user-specific requirements during operation, measures are provided which enable the required information about the illumination setting and/or the pattern to be imaged to be made accessible to the control unit of the projection lens.

It is preferably provided that at least one portion of the pattern data and/or of the illumination setting data is determined by one or a plurality of measurements serving for data acquisition on the projection lens. Consequently, the method does not rely on a user necessarily providing the data required for the optimization of the projection lens. This can be used for automating the adaptation.

In some embodiments, all of the use case data required for determining the imaging specification data are determined by one or a plurality of measurements on the projection lens. In this case, cooperation of the user in the optimization of the projection lens for the specific use case is not required, and so the imaging behaviour of the projection lens can be adapted automatically, possibly also in a manner imperceptible to the user, but to the user's benefit or advantage.

It is considered to be advantageous if the pattern data include at least core region structure data. Core region structure data contain quantitative information about the structure of core regions, wherein core regions are regions having the smallest line spacing and/or the smallest periodicity length (pitch) of a group of mutually parallel lines in the pattern. The lines of the core region form the "core region structure".

In this case, it is assumed that the core region structures are the structures of the pattern that are the most difficult to image. For the imaging of these structures, the wavefront of the projection radiation should be particularly smooth (in the sense of a particularly small gradient) or corrected well in those regions which are required for imaging the core region structures.

Preferably, the pattern data should include at least core region structure orientation data representing an orientation of lines of the core region structure of the pattern. Given knowledge of the core region structure orientation data, the imaging performance of the projection lens can be optimized such that the resolution capability in the direction perpendicular to the lines is set sufficiently well on account of the wavefront that is particularly smooth in this direction. By contrast, the specification for the resolution capability or for the quality of the wavefront in a direction perpendicular to the orientation of the lines can be relaxed, which overall facilitates the setting of the projection lens to the use case.

Core region structure orientation data can be derived for example from illumination setting data containing information about the orientation of the poles of a dipole illumination set on the illumination system by the user, since, in order to obtain two-beam interference, these are often set such that the connecting line between the poles runs perpendicular to the orientation of the lines of the core region structure.

Preferably, the pattern data should include further data in addition to the core region structure orientation data. In particular, core region structure position data representing a position of lines of a core region structure within the pattern can be useful. Information about the required field dependence of the quality of the wavefront of the projection radiation can be derived on the basis of the core region structure position data. If, by way of example, a core region structure lies at a right edge of a pattern, while only coarser peripheral structures are present at the left edge, then it may suffice to sufficiently correct the wavefront only for those field points which are crucial for the imaging of the core region structure at the right edge, while the imaging specifications for other field points can be relaxed.

By determining peripheral region structure orientation data representing an orientation of lines at the peripheral structure of the pattern, and/or peripheral region structure position data representing a position of lines of a peripheral structure within the pattern, it is possible to implement further pattern-specific optimizations of the imaging behaviour of the projection lens.

Preferred variants of determining imaging specification data using the use case data are based on the following considerations, inter alia.

In general, imaging specifications are specified in the form of maximum contributions of individual Zernikes and/or maximum contributions of (weighted) linear or quadratic Zernike sums. Examples of a weighted quadratic Zernike sum are RMS or grouped RMS (first-, second-, third- or fourth-order). One example of a weighted linear Zernike sum is the overlay contribution for core region structures based on a specific illumination setting.

In general, for each field point $FP_1, \ldots, FP_M$, there are a plurality of imaging specifications, for example $S_1(FP_1), \ldots, S_N(FP_M)$.

If uniform specifications are chosen independently of the concrete field point, then $S_1(FP_1) = \ldots = S_1(FP_M), \ldots, S_N(FP_1) = \ldots = S_N(FP_M)$ holds true. This approach, i.e. uniform specifications for all field points, is routine practice in the prior art.

In a departure therefrom, preferably imaging specification data are determined with regard to the use case data in such a way that imaging specification data of at least two field points differ in regard to at least one imaging specification. The imaging specifications are therefore determined "individually" as it were specifically for the use case depending on the concrete field point. The imaging specification data can thus differ for differently located field points.

One example may illustrate the benefit of this approach. For non-rotationally symmetrical Zernikes, for example $Z_{17}$ and $Z_{18}$, the $Z_{17}$ interrogates different wavefront ranges than the $Z_{18}$. Correspondingly, in the case of an x-dipole, the $Z_{17}$ will have a narrower specification than the $Z_{18}$, while in the case of a rotated x-dipole the $Z_{18}$ (or generally a linear combination of $Z_{17}$ and $Z_{18}$) has a narrower specification.

Attributing the imaging specification data to the selected structure data has the consequence that the following question is answered: for a given use case what are the largest possible specifications for which a reliable imaging can still be ensured?

The imaging specification data can include one or more structure data selected from the following group:
core region structure orientation data, core region structure position data, peripheral structure orientation data, peripheral structure position data, in such a way that there are two field points whose imaging specification data, in particular wavefront specification data, differ in at least one aspect and/or
there is one field point at which the wavefront specification for a wavefront for an nth order wavefront expansion function differs in at least one aspect from the wavefront rotated by an angle of 90°/n, wherein this difference is attributable to the selected structure data.

The nth-order wavefront expansion function can be e.g. an nth-order Zernike.

On the basis of the example of Zernike coefficients $Z_m$, this can be understood for example as follows. It is assumed that there are different field points $FP_i$ and $FP_j$ and an imaging specification $S_k$, such that the condition: $S_k(FP_i) \neq S_k(FP_j)$ holds true. The first field point $FP_i$ can be e.g. a field point in a core region, while the second field point $FP_j$ is intended to lie in the region of the peripheral structures. The imaging specification $S_k$ shall be an odd-order Zernike, that is to say e.g. a first-order or third-order or fifth-order or seventh-order Zernike, such as for example $Z_2$ or $Z_3$ or $Z_7$ or $Z_8$ (first-order) or $Z_{10}$ or $Z_{11}$ (third-order) or $Z_{26}$ or $Z_{27}$ (fifth-order) or $Z_{50}$ or $Z_{51}$ (seventh-order). If the lines to be imaged having the smallest line spacing are rotated, then a suitable linear combination of, for example, $Z_2$ and $Z_3$, or of $Z_2$ and $Z_8$, or of $Z_{10}$ and $Z_{11}$ or $Z_{26}$ or $Z_{27}$ or $Z_{50}$ or $Z_{51}$ can also be specified. The odd-order Zernikes are considered to be particularly relevant here because, inter alia, they dominate the overlay that is important for double patterning or quadruple patterning.

The imaging specification can be chosen e.g. such that a specification ratio between the imaging specification for a first field point in the core region and the imaging specification for the second field point in the peripheral region deviates from the value 1 significantly, e.g. by at least 10% or at least 30% or at least 50%. In particular, e.g. the condition:

$$\max(S_k(FP_i)/S_k(FP_j), S_k(FP_j)/S_k(FP_i)) \geq \alpha$$

can hold true, wherein $\alpha \geq 1.5$. In particular, $\alpha \geq 2$ or even $\alpha \geq 5$ can also hold true.

A particularly precise adaptation of the imaging behaviour of the projection lens to the use case is possible in preferred embodiments by virtue of the fact that at least one subset of use case data and/or imaging specification data for a use case is determined via an extrinsic data acquisition and is communicated to the control unit of the projection lens. There are various possibilities for extrinsic data acquisition, which can be used individually or in a combination of a plurality of measures. One possibility is for the desired data to be interrogated by the user via a user interface. For this purpose, a corresponding user interface with screen and keyboard or the like can be provided on an operating unit of the projection lens or of the projection exposure apparatus. Alternatively or additionally, it is also possible to retrieve at least one portion of the relevant data from a memory that is accessible to a control unit of the projection lens.

The stored data can contain e.g. information about the illumination system, about the projection lens and/or about the reticle. By way of example, via a data line, information concerning the settings on the illumination system of the projection exposure apparatus can be retrieved and used when determining the imaging specification data. Information concerning the reticle can be read in e.g. in the form of a reticle ID via a scanner (and bar code). Detailed information associated with the reticle ID can then be retrieved from a database that is accessible to the control unit of the projection lens. Alternatively, e.g. an RFID chip that contains all the relevant information and is readable can be provided on the reticle.

As an alternative or in addition to an extrinsic data acquisition, an intrinsic data acquisition can be effected by measurements on or in the projection lens. In this case, e.g. determining use case data can include determining in an automated manner projection radiation data representing at least one property of the projection radiation passing from the object plane in the direction of the image plane of the projection lens. This makes use of the possibility of obtaining at least one portion of the pattern data and/or of the illumination setting data using the projection radiation data. If appropriate, all the data required for the adaptation of the projection lens to the use case can be implemented by such an automated data acquisition on the basis of effects measureable on the projection lens, such that no additional information need be provided by the user.

In some embodiments, the determination of projection radiation data includes a measurement of a wavefront of the projection radiation at one or a plurality of field points. A wavefront measurement has the advantage, inter alia, that properties of the wavefront, which is ultimately crucial to the imaging quality of the projection lens, can thereby be determined directly. Suitable systems for wavefront measurement are already present for other purposes in many projection exposure apparatuses, and so they can be used for the intrinsic data acquisition in the context of embodiments of the present disclosure.

The patent specifications U.S. Pat. No. 7,333,216 A1 and U.S. Pat. No. 6,650,399 A1 show examples of wavefront measuring systems which can be used, in principle, when carrying out the method. The disclosure content of the documents with regard to the construction and function of the wavefront measuring systems is incorporated in the content of the present description.

As an alternative or in addition to a wavefront measurement, the determination of projection radiation data can also include a determination of intensity distribution data representing a two-dimensional distribution of radiation intensity of the projection radiation at at least one reference surface lying between the object plane and the image plane in the projection beam path.

It is possible that at least one optical surface of an optical element that is arranged in the beam path of the projection lens is used as reference surface. The reference surface can thus be for example an optical surface of an optical element, for example of a lens element (refractive optical element) or of a mirror (reflective optical element), that is arranged in the beam path of the projection lens. If the optical element is a mirror and the optical surface is a mirror surface, from the intensity distribution data it is possible in a particularly simple manner to draw a conclusion about the wavefront alteration caused thereby, since induced mirror heating deterministically induces a reversible change in the mirror surface and wavefront alterations as a result. It is also possible for the reference surface to be formed by the surface of a stop or by a surface on a mask (reticle) or a substrate to be exposed (e.g. wafer). If appropriate, the reference surface can also be situated at or in an immersion liquid.

A direct measurement in the region of the immersion liquid can be advantageous because, inter alia, the situation directly in a field plane can be determined by the measurement and very good conclusions about the distribution of the core and/or peripheral structures of the reticle are thus possible. By exchanging the immersion liquid at intervals, it is possible, if appropriate, to dispense with fully solving the heat conduction equation and deducing the intensity distribution.

A measurement of the radiation intensity distribution within the projection radiation is possible. In some embodiments, an indirect determination of the intensity distribution data is achieved by virtue of the fact that, for determining intensity distribution data, a two-dimensional temperature distribution at the reference surface is measured in a spatially resolved manner.

In this case, it is assumed that the projection radiation incident on a reference surface causes there heating which is proportional to the intensity and which can be detected by suitable temperature-sensitive measuring systems. The two-dimensional temperature distribution can be acquired for example via one or a plurality of thermal imaging cameras (infrared cameras) or via one or a plurality of other temperature sensors. If appropriate, it is possible to carry out an extrapolation and/or an interpolation of the measurement values and/or the matching of the measurement values with a predictive model in order to obtain more precise measurement values. Alternatively or additionally, when determining intensity distribution data from a two-dimensional temperature distribution at a reference surface it is also possible to take account of heat conduction effects by solving a heat conduction equation, in order to improve the precision when determining the intensity distribution in the projection radiation.

In one embodiment, first intensity distribution data are determined at a first reference surface, which lies at or in proximity to a pupil plane of the projection lens, and illumination setting data are determined using the first intensity distribution data. This method variant makes use of the fact that the intensity distribution near or in a pupil plane of the projection lens is substantially determined by the intensity distribution in a pupil plane of the illumination system that is optically conjugate with respect thereto, such that, by determining the intensity distribution in the pupil plane of the projection lens with sufficient precision, it is possible to draw conclusions about the illumination setting (e.g. dipole illumination, quadrupole illumination, conventional illumination or the like). The influence of the illuminated pattern on the intensity distribution in the region of the pupils into the projection lens can be disregarded here to a first approximation. If appropriate, however, this influence can also be taken into account in the determination. Pattern data can also be derived, if appropriate.

Preferably, second intensity distribution data are determined at a second reference surface, which lies at or in proximity to a field plane of the projection lens, and pattern data are determined using the second intensity distribution data. This measure is based on the consideration, inter alia, that an image of the pattern and of the structures distributed therein forms in a field plane of the projection lens and that in proximity to a field plane such an image may still be present at least approximately in defocused form. Consequently, it is possible to obtain information about the lateral distribution of core region structures and peripheral structures, for example, on the basis of the second intensity distribution data.

By way of example, the subaperture ratio SAR can be used for quantifying the position of an optical element or of an optical surface in the beam path.

In accordance with one illustrative definition, the subaperture ratio SAR of an optical surface of an optical element in the projection beam path is defined as the quotient between the subaperture diameter DSA and the optically free diameter DCA in accordance with SAR:=DSA/DCA. The subaperture diameter DSA is given by the maximum diameter of a partial area of the optical element which is illuminated with rays of a beam proceeding from a given field point. The optically free diameter DCA is the diameter of the smallest circle around a reference axis of the optical element, wherein the circle includes that region of the area of the optical element which is illuminated by all rays coming from the object field.

In a field plane (e.g. object plane or image plane), SAR=0 accordingly holds true. In a pupil plane, SAR=1 holds true. "Near-field" surfaces thus have a subaperture ratio which is close to 0, while "near-pupil" surfaces have a subaperture ratio which is close to 1.

Preferably, in the case of a reference surface arranged near-pupil, the subaperture ratio is between 0.5 and 1, in particular in the range of between 0.7 and 1. In the case of a reference surface arranged near-field, the subaperture ratio is preferably between 0 and 0.5, in particular in the range of between 0 and 0.3.

Particularly precise information concerning the imaging-relevant use case data are generally obtainable if first intensity distribution data are determined at a first reference surface and also second intensity distribution data are determined at a second reference surface and the use case data are then determined using both these types of intensity distribution data.

In preferred variants, a fast and sufficiently precise evaluation of intensity distribution data arises by virtue of the fact that use case classification data are stored in a memory accessible to the control unit of the projection exposure apparatus, the data containing for a multiplicity of combinations of an illumination setting and a mask structure in the illumination region corresponding intensity distribution data for at least one reference surface lying between the object plane and the image plane, wherein projection radiation data are determined using the use case classification data.

Pattern recognition methods and/or feature extraction methods can be used for example when determining pattern data and/or illumination setting data from the projection radiation data. These methods can also be employed advantageously when comparing measured intensity distribution data with the use case classification data, in order to determine basic information about the specific use case rapidly and reliably.

When determining intensity distribution data from a two-dimensional temperature distribution at an optical surface, it is possible, if appropriate, to take account of heat conduction effects by solving a time-invariant heat conduction equation.

As a result of the adaptation of the projection lens to the requirements of a specific use case, the situation can occur that although the projection lens is set optimally for this use case, it would no longer have sufficient imaging performance in the case of a different pattern and/or a different illumination setting. For this reason, inter alia, in some embodiments it is provided that first use case data of a first projection exposure are compared with second use case data of a directly or indirectly succeeding second projection exposure and the comparison leads to the generation of use case comparison data. On the basis of the use case comparison data, it is possible to monitor whether the projection lens is set correctly for the respective use case.

In particular, it is possible to generate a use case change signal indicating a change of the use case in a manner dependent on the use case comparison data. The change may be present, for example, if a different illumination setting is employed for the same mask structure, if a different pattern is illuminated with the same illumination setting and/or if both the illumination setting and the pattern are altered from one projection exposure to the next. If a use case change is indicated core region structure then readjustments can be made on the projection lens in a timely manner in order to ensure an optimum adaptation of the projection lens for the new use case as well.

The disclosure also relates to a projection exposure apparatus configured for carrying out the projection exposure method. The projection exposure apparatus includes a system for adapting the imaging behaviour of the projection lens to a specific use case, wherein the system includes units for determining use case data specific to the use case, units for determining imaging specification data using the use case data, and a control unit assigned to the projection lens and configured such that controllable optical components of the projection lens are controllable by the control unit in a manner dependent on the imaging specification data in order to adapt the imaging behaviour of the projection lens to the use case.

Advantageous configurations are described further below on the basis of concrete exemplary embodiments.

The above features and further features are evident not only from the claims but also from the description and from the drawings, wherein the individual features can in each case be realised by themselves or as a plurality in the form of subcombinations in an embodiment of the disclosure and in other fields and constitute advantageous and inherently protectable embodiments. Exemplary embodiments of the disclosure are illustrated in the drawings and explained in greater detail below.

BRIEF DESCRIPTION OF THE DRAWINGS

FIG. 4A-4E, FIG. 5A-5I to FIG. 6A-6I show exemplary embodiments for determining information about position and orientation of core region structures and peripheral structures from temperature distribution measurements on a near-field optical element and a near-pupil optical element and also information about the illumination setting.

DETAILED DESCRIPTION OF THE PREFERRED EMBODIMENTS

Figure 1A:
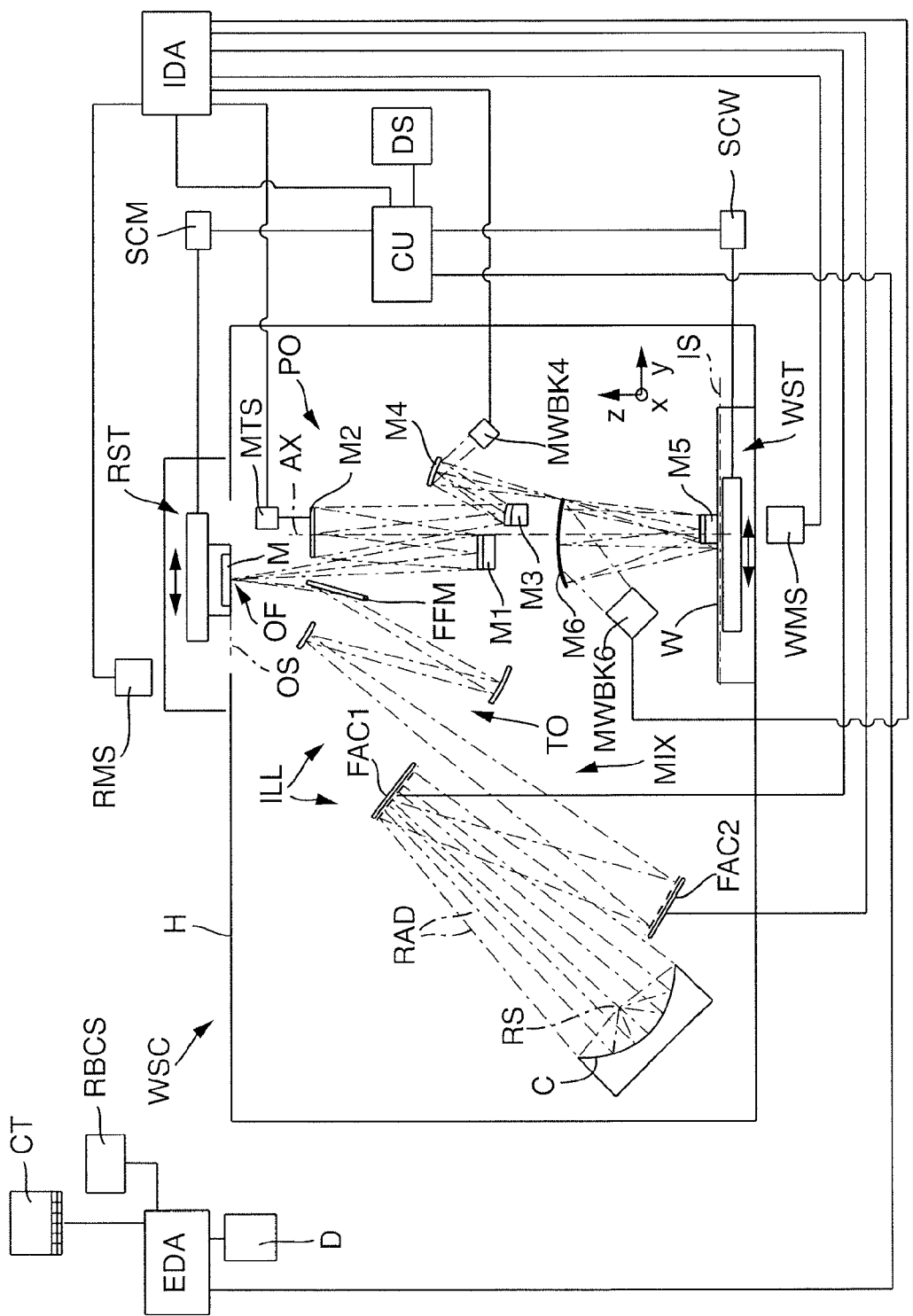
FIG. 1A shows components of an EUV microlithography projection exposure apparatus in accordance with one embodiment of the disclosure, and in FIG. 1B details of a projection lens in accordance with another embodiment.
Figure 1B:
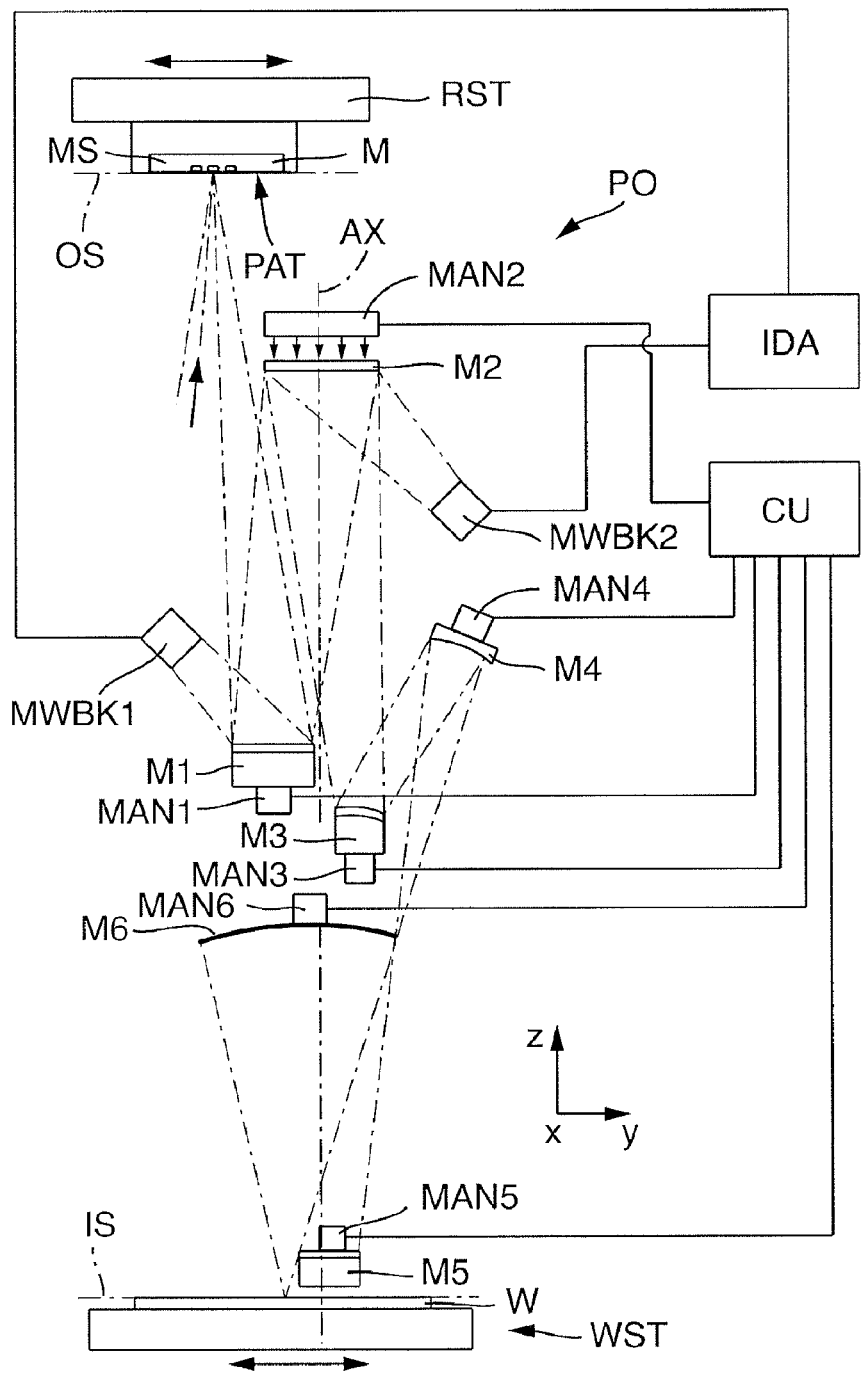

FIG. 1 shows in 1A components of an EUV microlithography projection exposure apparatus WSC for exposing a radiation-sensitive substrate W, which is arranged in the region of an image plane IS of a projection lens PO, with at least one image of a pattern of a reflective mask M, the pattern being arranged in the region of an object plane OS of the projection lens. FIG. 1B shows details of a projection lens in a variant that is equipped differently in specific detail.

The projection exposure apparatus is operated with the radiation of a primary radiation source RS. An illumination system ILL serves for receiving the radiation of the primary radiation source and for shaping illumination radiation directed onto the pattern. The projection lens PO serves for imaging the structure of the pattern onto the light-sensitive substrate W.

The primary radiation source RS can be, inter alia, a laser plasma source or a gas discharge source or a synchrotron-based radiation source. Such radiation sources generate radiation RAD in the extreme ultraviolet range (EUV range), in particular having wavelengths of between 5 nm and 15 nm. In order that the illumination system and the projection lens can operate in this wavelength range, they are constructed with components that are reflective to EUV radiation.

The radiation RAD emerging from the radiation source RS is collected via a collector C and guided into the illumination system ILL. The illumination system includes a mixing unit MIX, a telescope optical unit TO and a field forming mirror FFM. The illumination system shapes the radiation and thus illuminates an illumination field situated in the object plane OS of the projection lens PO or in proximity thereto. In this case, the form and size of the illumination field determine the form and size of the effectively used object field OF in the object plane OS. The illumination field is generally in the shape of a slot having a high aspect ratio between width and height.

During operation of the apparatus, a reflective mask M is arranged in the object plane OS. The projection lens PO here has six mirrors M1 to M6 and images the pattern of the mask into the image plane on a reducing scale, the substrate to be exposed, e.g. a semiconductor wafer, being arranged in the image plane.

The mixing unit MIX substantially consists of two facet mirrors FAC1, FAC2. The first facet mirror FAC1 is arranged in a plane of the illumination system that is optically conjugate with respect to the object plane OS. It is therefore also designated as a field facet mirror. The second facet mirror FAC2 is arranged in a pupil plane of the illumination system that is optically conjugate with respect to a pupil plane of the projection lens. It is therefore also designated as a pupil facet mirror.

With the aid of the pupil facet mirror FAC2 and the imaging optical assembly disposed downstream in the beam path and including the telescope optical unit TO and the field forming mirror FFM operated with grazing incidence, the individual mirroring facets (individual mirrors) of the first facet mirror FAC1 are imaged into the object field.

The spatial (local) illumination intensity distribution at the field facet mirror FAC1 determines the local illumination intensity distribution in the object field. The spatial (local) illumination intensity distribution at the pupil facet mirror FAC2 determines the illumination angle intensity distribution in the object field OF.

A unit RST for holding and manipulating the mask M (reticle) is arranged such that the pattern PAT arranged on the mask lies in the object plane OS of the projection lens PO, the object plane here also being designated as the reticle plane. The mask is movable in this plane for scanner operation in a scanning direction (y-direction) perpendicular to the reference axis AX of the projection lens (z-direction) with the aid of a scan drive SCM.

The substrate W to be exposed is held by a unit WST including a scanner drive SCW in order to move the substrate synchronously with the mask M perpendicularly to the reference axis AX in a scanning direction (y-direction). Depending on the design of the projection lens PO, these movements of mask and substrate can be effected parallel or antiparallel to one another.

The unit WST, which is also designated as "wafer stage", and the unit RST, which is also designated as "reticle stage", are part of a scanner unit controlled via a scanning control unit, which in the case of the embodiment is integrated into the central control unit CU of the projection exposure apparatus.

All optical components of the projection exposure apparatus WSC are accommodated in an evacuatable housing H. The projection exposure apparatus is operated under vacuum.

EUV projection exposure apparatuses having a similar basic construction are known e.g. from WO 2009/100856 A1 or WO 2010/049020 A1, the disclosure of which is incorporated by reference in the content of this description.

The mask M has a mask substrate MS having a structured, macroscopically substantially planar front side. A multilayer arrangement containing e.g. alternating layers of molybdenum and silicon or ruthenium and silicon, the multilayer arrangement being reflective to EUV radiation, is situated on the front side. The pattern PAT of the mask is formed by one or a plurality of structured absorber layers, which can consist e.g. of a tantalum-based absorber material. In the illustrated incorporated operating state, the front side faces the illumination system ILL and the projection lens PO in such a way that the illumination radiation ILR provided by the illumination system impinges on the pattern obliquely, i.e. at an angle different from zero with respect to the surface normal of the front side, is altered by the pattern and is then radiated as projection radiation PR obliquely into the projection lens PO.

The projection exposure apparatus is equipped with a system for adapting the imaging behaviour of the projection lens PO to a specific use case or user case, which system enables the projection lens to automatically adapt its imaging properties, within certain limits predefined by the design, to a specific use case such that imaging properties which are optimized for the specific use case are achieved. For this purpose, provision is made of units for determining use case data specific to the use case, which serve for internal and external data acquisition for a specific use case. With the aid of the use case data, imaging specification data specifying the imaging behaviour of the projection lens that is expedient for the use case are then determined by corresponding units. The projection lens is equipped with controllable optical components which can be driven on the basis of the imaging specification data with the aid of the control unit CU assigned to the projection lens, in order to alter the imaging properties of the projection lens and to adapt them to the use case (cf. FIG. 1B).

Information about a specific use case can be determined, in principle, by intrinsic data acquisition and/or by extrinsic data acquisition. The intrinsic data acquisition substantially uses data which can be determined on components of the projection exposure apparatus directly or indirectly with the aid of suitable measuring systems. Via extrinsic data acquisition, by way of example, data can be interrogated by a user via a user interface. It is also possible to retrieve a portion of relevant data from corresponding memories containing information about the illumination system, the projection lens and/or the reticle provided for the use case.

Some of these systems are explained on the basis of the example of the projection exposure apparatus in FIG. 1. It is important to emphasize here that for carrying out the adaptations to the use case possibly only one or two to three of the systems mentioned should be present on a projection exposure apparatus. Although the different systems are described on the basis of a single exemplary embodiment, it is obvious to the person skilled in the art that individual units or groups of units can optionally be provided as an alternative to other units or in addition thereto.

A system for intrinsic data acquisition typically has a unit IDA for intrinsic data acquisition, to which one or a plurality of measuring and acquiring units can be connected. A wavefront measuring system WMS is designed to perform a measurement of the wavefront of the projection radiation which passes in the projection lens from the mask to the substrate to be exposed. A spatially resolving measurement for a plurality of field points is preferably provided. By way of example, it is possible to provide wavefront measuring systems of the type described in U.S. Pat. No. 7,333,216 A1 or U.S. Pat. No. 6,650,399 A1, the disclosure content of which in this respect is incorporated by reference in the content of this description.

Alternatively or additionally, it is possible to provide a reticle measuring system RMS designed to measure the structures of the pattern of the mask e.g. optically and to acquire e.g. information about the core region structures, in particular the local position thereof within the pattern and information concerning the orientation of the lines of the core region structure.

A temperature measuring system MTS is designed to acquire the local mirror temperatures in the illuminated region on the second mirror M2 in a spatially resolved manner and to determine therefrom a two-dimensional temperature distribution at this mirror surface serving as a reference surface. The temperature measuring system can contain e.g. a multiplicity of temperature sensors arranged in a two-dimensional distribution in the mirror substrate in proximity to the multilayer reflection layer.

Alternatively or additionally, provision can be made of at least one thermal imaging camera for the spatially resolving recording of the heat distribution at a mirror surface. In the case of the example illustrated, the heat distribution at the concave mirror surface of the sixth mirror M6 is acquired in a spatially resolving manner via the thermal imaging camera MWBK6, and the heat distribution at the concave mirror surface of the fourth mirror M4 is acquired in a spatially resolving manner via the thermal imaging camera MWBK4.

If the mirror used for measurement is a mirror mounted in proximity to or in a pupil plane of the projection lens (that is to say "near-pupil"), then relevant information about the illumination setting chosen can be derived therefrom. In the case of a mirror arranged near-field, it is possible, if appropriate, to derive information about the position of core region structures within the pattern.

In the case of the example in FIG. 1A (and FIG. 1B), the first mirror M1 and the fourth mirror M4 are in each case arranged in optical proximity to a field plane, that is to say "near-field", wherein the subaperture ratio SAR is approximately 0.3 in the case of M1 and approximately 0.15 in the case of M4. By contrast, the second mirror M2 and the sixth mirror M6 are in each case arranged in optical proximity to a pupil plane, that is to say "near-pupil", wherein the subaperture ratio SAR is approximately 0.8 in the case of M2 and approximately 0.9 in the case of M6.

In the example in FIG. 1B, two near-pupil mirrors (M2 and M6) are monitored with regard to the thermal distribution. Measurement errors can be reduced by comparison and computational accounting of the respective measurement results. In general, it suffices if for each type (near-field and near-pupil) respectively only one optical surface is acquired metrologically.

In order to obtain information about the illumination setting respectively set, the system for intrinsic data acquisition data also acquires the mirror positions of the first facet mirror FAC1 (field facet mirror) and of the second facet mirror FAC2 (pupil facet mirror), in order to determine in particular the local illumination intensity distribution in the object field (at the reticle).

A system for external data acquisition has a unit EDA for external data acquisition to which in turn one or a plurality of components can be connected. A computer terminal CT serves for the inputting of data by a user. A reticle data acquisition device RBCS can contain for example a reticle bar code scanner and/or an RFID receiver in order to obtain relevant information about the reticle, in particular about the pattern applied to the reticle, from a reticle database with the aid of the acquired identification data of the reticle. A connected database D allows access to stored use case data.

The unit IDA for intrinsic data acquisition and the unit EDA for extrinsic data acquisition are connected to the control unit CU of the projection exposure apparatus and the central data memory DS connected thereto and can exchange data with them.

The projection lens includes a manipulation system having a multiplicity of manipulators which make it possible to alter the imaging properties of the projection lens in a defined manner on the basis of control signals of the control unit CU. In this case, the term "manipulator" denotes, inter alia, optomechanical units designed for actively acting—on the basis of corresponding control signals—on individual optical elements or groups of optical elements in order to alter the optical effect thereof. In general, manipulators are set such that metrologically acquired imaging aberrations can be reduced in a targeted manner. Manipulators are often also provided in order for example to displace, to tilt and/or to deform the mask or the substrate. A manipulator can be designed e.g. for a decentration of an optical element along a reference axis or perpendicular thereto or for a tilting of an optical element. In this case, the manipulators bring about rigid-body movements of optical elements. It is also possible locally or globally to heat or cool an optical element with the aid of a thermal manipulator and/or to introduce a deformation of an optical element. For this purpose, a manipulator contains one or a plurality of actuating elements or actuators, the present actuating value of which can be changed or adjusted on the basis of control signals of the control system.

FIG. 1B shows by way of example a system of manipulators MAN1 to MAN6 which are assigned to the mirrors M1 to M6 of the projection lens PO and are in each case connected to the control unit CU. Each of the manipulators MAN1 to MAN6 allows rigid-body movements of the associated mirror, that is to say in particular a tilting, a displacement parallel to the reference axis AX and/or a displacement perpendicular to the reference axis AX. The second manipulator MAN2 associated with the second mirror M2 (optically in proximity to a pupil, SAR approximately 0.8) is a deformation manipulator having a multiplicity of independently driveable actuators which allow the mirror surface of the second mirror to be deformed one-dimensionally or two-dimensionally. This may involve, for example, a thermal manipulator (mirror deformation by means of nonuniform heating) or a mechanical manipulator (mirror deformation via a mechanism of mechanical actuation).

In the exemplary embodiment in FIG. 1B, a system for internal data acquisition is provided which allows information about the present use case to be determined from the two-dimensional intensity distributions of the projection radiation at the first mirror M1 and at the second mirror M2. The mirror surface of the first mirror M1 is arranged optically relatively near the object plane OS and is designated here as "near-field mirror". By contrast, the mirror surface of the second mirror M2 is arranged in or very near the closest pupil surface, which is a Fourier-transformed surface with respect to the object plane OS. The second mirror M2 is therefore also designated as "pupil mirror".

In the case of the second mirror M2 arranged near-pupil, the subaperture ratio SAR is in the range of between 0.7 and 1, namely approximately 0.8. In the case of the first mirror M1 arranged near-field, the subaperture ratio is in the range of between 0 and 0.4, namely approximately 0.3.

A first thermal imaging camera MWBK1 is arranged in relation to the first mirror M1 such that its two-dimensional image field acquires the entire illuminated region of the first mirror, such that it is thereby possible to record a two-dimensional temperature distribution on the first mirror. A second thermal imaging camera MWBK2 is arranged correspondingly relative to the mirror surface of the second mirror M2 in order to acquire the entire illuminated region of the pupil mirror.

An explanation is given below of how, on the basis of the two-dimensional intensity distributions on a near-field mirror and a near-pupil mirror that are acquired via these units, it is possible to obtain information about the lateral distribution of core region structures and peripheral structures in the pattern PAT of the mask M.

Figure 2:
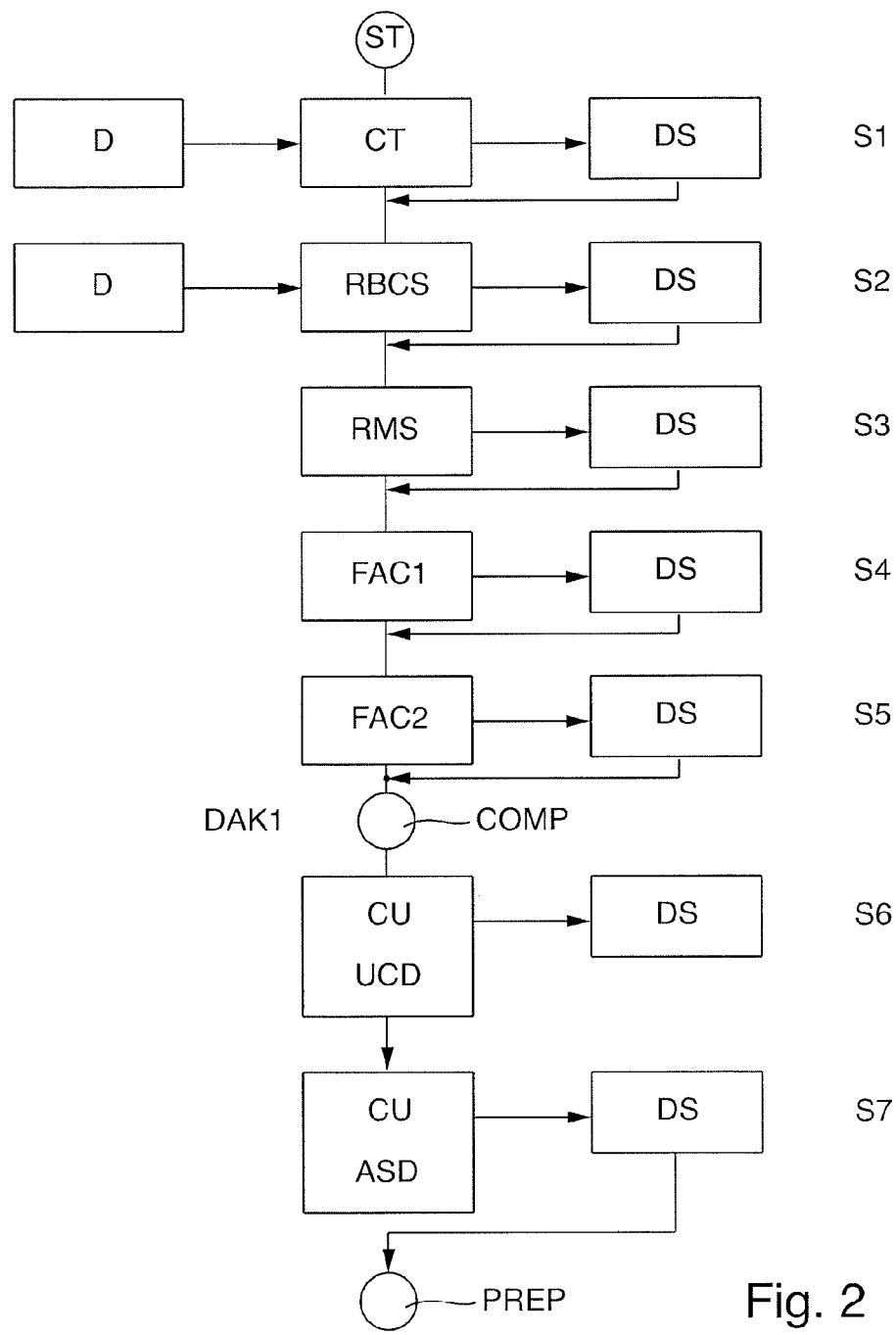
FIG. 2 and FIG. 3 show flow charts representing a possible sequence of steps during the operation of the projection exposure apparatus.
Figure 3:
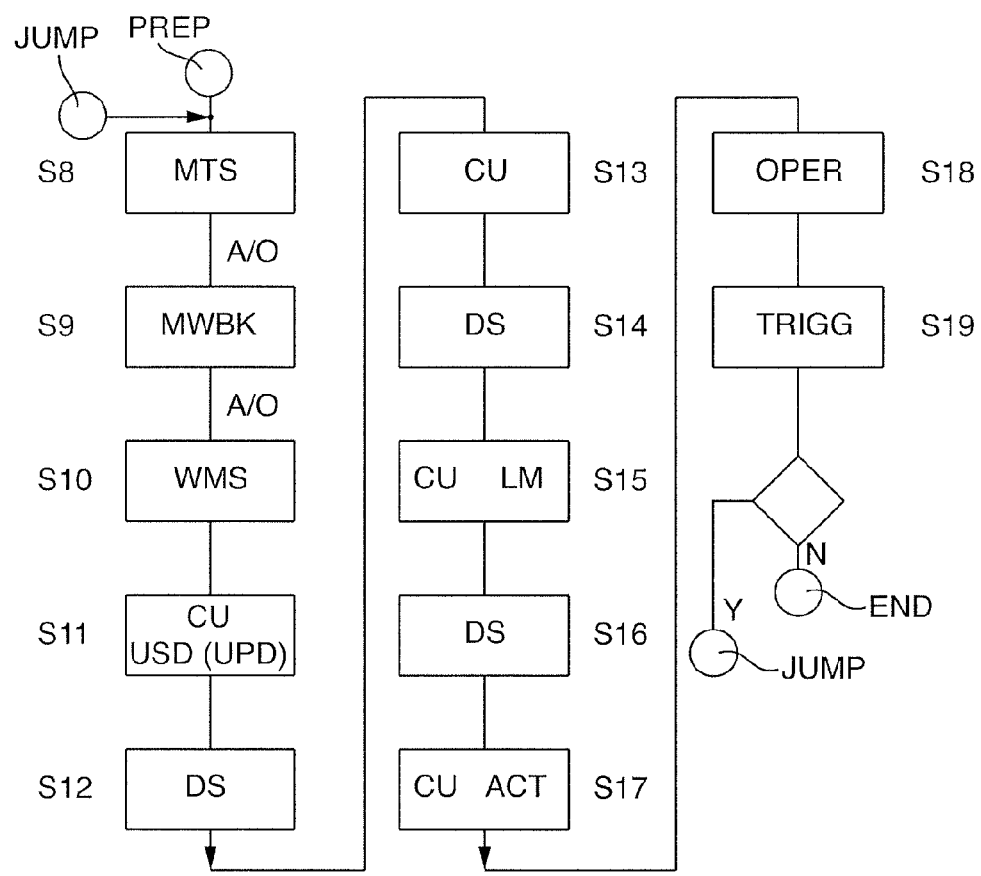
Figure 6C:
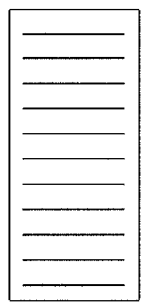
Figure 6E:
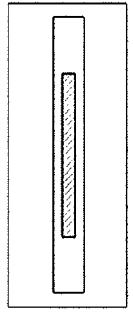
Figure 6G:
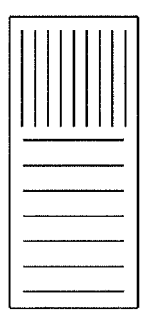
Figure 6I:
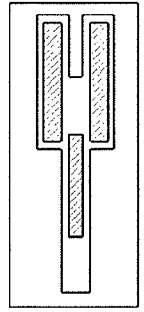
Figure 6B:
Figure 6D:
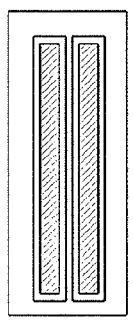
Figure 6F:
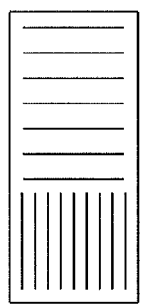
Figure 6H:
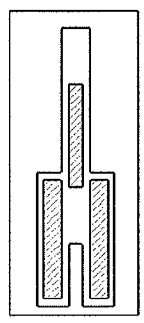
Figure 6A:
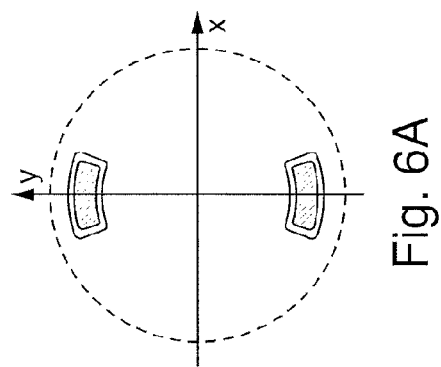

Possible operation of the projection exposure apparatus is explained generally in connection with the flow charts in FIGS. 2 and 3. In this case, FIG. 2 shows in part optional steps from the start ST before or after incorporation of a new reticle until the end of the preparation for the lens start (PREP). FIG. 3 shows in part optional further steps for optimizing the projection lens during operation.

In the optional step S1, use case data are input by an operator via the computer terminal CT. Use case data can also be read out from the database D with access to stored use case data. If use case data are input via the computer terminal CT, they can be stored in the central data memory DS.

In the optional step S2, a reticle identification about a reticle to be incorporated or an incorporated reticle is read in from the reticle e.g. with the aid of a bar code scanner or an RFID receiver and corresponding reticle information is read out from the database D. By way of example, information about position and orientation of core region structures can be stored here. If information is acquired by this route, it is stored in the central data memory DS.

If a reticle measuring system RMS is present and used, in the optional step S3 information for example about position and orientation of core region structures and peripheral structures can be determined with the aid of the reticle measuring system via the measurement of the pattern.

In the optional steps S4 and S5, information about the illumination setting presently set on the illumination system can be acquired by corresponding sensors at the first facet mirror FAC1 and respectively at the second facet mirror FAC2. Corresponding illumination setting data can be stored in the data memory DS.

All of steps S1 to S5 of the external data acquisition are optional. It is possible that one or a plurality of the devices provided for this purpose are provided on a projection exposure apparatus and used. Other embodiments have other or no systems for external data acquisition.

This upstream data acquisition is ended at the point in time DAK1 COMP. On the basis of the information present up to then, the control unit CU in step S6 calculates use case data UCD and stores them in the central data memory DS. On the basis of the data, the control unit CU in step S7 calculates provisional imaging specification data ASD and stores them in the central data memory DS. The projection exposure apparatus is thus prepared for a lens start at the point in time PREP.

If the reticle is incorporated in the predefined position and the illumination system is put into operation, the pattern of the mask is illuminated and the radiation modified by the pattern passes as projection radiation through the projection lens to the substrate W. In this phase, information about the present use case can be acquired with the aid of units of the internal data acquisition (cf. FIG. 3). In step S8, the local distribution of the temperature at the second mirror M2 is determined with the aid of the temperature measuring system MTS. Alternatively or additionally, in step S9, with the aid of the thermal imaging camera MWBK, the local heat distribution on the concave mirror surface of the sixth mirror M6 can be determined and corresponding data can be generated. Alternatively or additionally, in step S10, the wavefront measuring system WMS can be used to measure the wavefront of the projection radiation passing through the projection lens e.g. in the exit pupil of the projection lens for a plurality of field points. Each of steps S8 to S10 is optional, and the abbreviation "A/O" stands for "AND/OR". The information about the use case determined in this way is processed by the control unit CU for calculating an update of the use case data USD (UPD) in step S11. In step S12, the data are stored in the central data memory S12 for use for the further control.

In step S13, the control unit CU calculates control data and specifications (imaging specification data) for the use case whose special nature was characterized by external and internal data acquisition in the previous steps. After the corresponding data have been stored in the central data memory DS (step S14), the control unit determines, on the basis of these use case data, a lens model LM adapted thereto (step S15). The control parameters of the lens model are stored in the central data memory DS in step S16. In step S17, the lens model is then activated by the control unit CU (CU ACT), such that in step S18 the projection exposure apparatus can be operated after a trigger (TRIGG) in step S19 on the basis of the lens model which was adapted to the specific reticle and specific properties of the illumination using use case data.

The operation of the projection exposure apparatus is continued with the imaging specification data determined in this way. In this case, the term "lens model" substantially denotes a projection exposure apparatus control algorithm. The lens model calculates how the manipulators are to be readjusted on the basis of a measurement (or a projection), and communicates corresponding control commands to the manipulator control unit. The imaging specification data determine how the "lens model" controls the projection exposure apparatus in order to achieve the desired imaging specifications.

With reference to FIGS. 4 to 6, by way of example an explanation will now be given of the way in which it is possible, in one embodiment, to obtain from temperature distribution measurements on a near-field optical element and a near-pupil optical element and information about the illumination setting conclusions about the position and orientation of core region structures and the position and orientation of peripheral structures which enable the projection lens to be adapted exactly to the present use case.

The use case data to be acquired for this substantially consist of pattern data and illumination setting data. Pattern data describe the reticle to be imaged or the pattern thereof with regard to the question of what imaging quality is desired at what field points. The imaging quality present where dense lines have to be imaged is higher than that present where less dense lines with a larger spacing have to be imaged. Accordingly, it is considered to be expedient for the pattern data to contain information about those regions where high imaging quality is involved (core region structure data) and about those regions where an imaging quality that is not as high is sufficient (peripheral structure data). The core region structure data include core region structure orientation data representing an orientation of lines of a core region structure of the pattern, and core region structure position data representing a position of lines of a core region structure within a pattern. Correspondingly, peripheral structure data include so-called peripheral structure orientation data representing the orientations of lines of the pattern which do not belong to the core region structures within the pattern, and peripheral structure position data representing the positions of such lines within the pattern.

If detailed direct information about the reticle to be imaged is not present or cannot be determined, in general it is possible to deduce fundamental properties of the pattern to be imaged with the aid of illumination setting data. Illumination setting data include, in particular, information about the set illumination setting, that is to say about the illumination intensity distribution in the pupil plane of the illumination system, which is also designated as the illumination pupil. They include for example x-dipole, y-dipole, quadrupole or a freeform pupil, i.e. an illumination intensity distribution which has no low symmetry and can be asymmetrical, for example.

FIGS. 4 to 6 show some examples that are suitable for explaining the basic principle.

In the case of FIG. 4, on the illumination system an x-dipole was set which is characterized in that the connecting line between the poles P1, P2 that are diametrically opposite with respect to the centre of the illumination pupil runs in the x-direction. Users usually set such an illumination intensity distribution if the intention is to image core region structures CO whose lines run parallel to the y-direction, that is to say perpendicular to the connecting line of the poles (FIG. 4B). For comparison, FIG. 4C shows peripheral structures PE whose lines run parallel to the x-direction. The corresponding illumination intensity distributions are shown underneath in FIG. 4D (core region structures) and 4E. The intensity distribution in the pupil PUP of the projection lens is determined by the intensity distribution in the pupil of the illumination system (FIG. 4A) and contains information about the diffraction at the structures of the pattern. Poles that are diametrically opposite in the x-direction (solid line) arise for the core region structures CO. In the illuminated regions, local heating of the mirror surface is established, which can be detected with the aid of the assigned thermal imaging camera. The dashed lines indicate the effect of the time-dependent heat distribution that leads to a lateral blurring of the heated regions. The lines of the peripheral structure that are oriented perpendicular to the lines of the core region structure produce diffraction in the y-direction, and the corresponding diffraction leads to the splitting of the poles in the y-direction, with the result that four regions of preferred heating arise in the pupil of the projection lens. In this case, the hatched regions represent the position of the orders of diffraction for the peripheral structures, and the poles without hatching represent the change thereof for smaller line widths. It is evident that the information about the illumination intensity distribution in the pupil of the projection lens (e.g. at the second mirror M2) already enables conclusions about core region structure data and peripheral structure data.

FIG. 5 shows different core region and peripheral structures and combinations thereof in conjunction with the associated heat distributions at an optical element positioned near-field in the case of an x-dipole illumination setting (FIG. 5A). The core region structures CO in each case run perpendicular to the connecting line between the poles P1, P2; the peripheral structures perpendicular thereto. In the depictions of the thermal distribution (5D, 5E, 5H, 5I) the regions T2 with a light border are at a higher temperature than the adjacent grey regions T1. It is evident that in the case of those patterns (FIGS. 5F, 5G) in which core region structures CO and peripheral structures PE are adjacent to one another in the x-direction, the side on which the denser core region structures are situated is evident on the basis of the heat distribution at a near-field optical element (FIGS. 5H, 5I). Consequently, core region structure position data and peripheral structure position data in addition to the corresponding orientation data are obtainable with the aid of temperature distributions acquired near-field.

FIG. 6 shows an illustration corresponding to FIG. 5 for the case where the lines of the core region structures run in the x-direction and those of the peripheral structures run in the y-direction. Such structures are expediently illuminated with y-dipole illumination (FIG. 6A) in order to use the two-beam interference for the denser core region structures. Here, too, it is apparent from FIGS. 6F to 6I that not only information about the orientation of core region structures and peripheral structures but also information about their relative positions in the pattern of the mask are obtainable via the acquisition of the heat distribution at a near-field optical element.

The intensity distributions acquired with the aid of the thermal imaging cameras MWBK1, MWBK2 are converted into corresponding core region structure data and peripheral structure data using an image processing mechanism. For this purpose it is possible to use methods of pattern recognition and/or feature extraction in the evaluation algorithms. The acquired intensity distributions can also be compared with standard intensity distributions stored in the form of use case classification data in a memory of the evaluation unit.

From the use case data thus determined, imaging specification data are then determined in a next step. This takes account of the fact that the specifications applicable at those field points at which core region structures do not have to be imaged can be less stringent specifications (e.g. in the form of larger permissible Zernikes) than those applicable at those field points at which core region structures have to be imaged.

Even at those field points at which core region structures are imaged, not all of the Zernikes have to be small. By way of example, it may suffice if those Zernikes (or combinations of Zernikes, such as $\cos 30°×Z_7+\sin 30°×Z_8$) are small which are oriented in the direction of the densest lines to be imaged of the core region structure. Other Zernikes and other orientations of the Zernikes (such as e.g. $\cos 60°×Z_7+\sin 60°×Z_8$) can indeed be large.

Preferred embodiments have been explained on the basis of EUV projection exposure apparatuses and methods. However, the use possibilities are not restricted thereto. The disclosure can also be used in the case of projection exposure apparatuses and methods which use radiation from the deep ultraviolet range (DUV) or vacuum ultraviolet range (VUV), e.g. at wavelengths of less than 260 nm, in particular at approximately 193 nm. The illumination system and the projection lens can then contain refractive optical elements, in particular lens elements, if appropriate in combination with one or a plurality of mirrors. The documents WO 2004/019128 A2 and WO 2005/111689 A2 disclose by way of example projection exposure apparatuses including catadioptric projection lenses having three imaging lens parts and correspondingly two intermediate images, wherein in the second lens part a concave mirror is arranged in the region of a pupil plane.

What is claimed is:

1. A method of using a projection exposure apparatus comprising an illumination system and a projection lens, the method comprising:
   illuminating an illumination region of a pattern with illumination radiation provided by the illumination system in accordance with an illumination setting specific to a use case, the illumination setting being characterized by illumination setting data and imaging-relevant properties of the pattern being characterized by pattern data;
   determining use case data specific to the use case, the use case data comprising pattern data and/or illumination setting data;
   using the use case data to determine imaging specification data;
   controlling optical components of the projection lens based on the imaging specification data to adapt imaging behavior of the projection lens to the use case; and
   using the projection lens adapted to the use case to image the pattern onto a substrate,
   wherein the method further comprises determining imaging specification data with regard to the use case data so that imaging specification data of at least two field points differ with respect to at least one imaging specification.

2. The method of claim 1, further comprising determining at least a portion of the pattern data and/or of the illumination setting data by at least one measurement to acquire data about the projection lens.

3. The method of claim 1, wherein:
   the pattern data comprise at least core region structure data containing quantitative information about the structure of core regions;
   the core regions comprise regions having the smallest line spacing and/or the smallest periodicity length of a group of mutually parallel lines in the pattern; and
   lines of the core region form the core region structure.

4. The method of claim 1, wherein the pattern data comprise core region structure orientation data representing an orientation of lines of a core region structure of the pattern.

5. The method of claim 4, further comprising deriving the core region structure orientation data from illumination setting data containing information about the orientation of poles of a dipole illumination set on the illumination system.

6. The method of claim 4, wherein the pattern data comprise, in addition to the core region orientation data, one or more data selected from the group consisting of:
   core region structure position data representing a position of lines of a core region structure within the pattern;
   peripheral region structure orientation data representing an orientation of lines of a peripheral structure of the pattern; and
   peripheral region structure position data representing a position of lines of a peripheral structure within the pattern.

7. The method of claim 1, wherein:
   an imaging specification $S_k$ has a specification ratio between an imaging specification $S_k(FP_i)$ for a first field point in the core region and a corresponding imaging specification $S_k(FP_j)$ for a second field point in the peripheral region that deviates from one; and $$\max(S_k(FP_i)/S_k(FP_j), S_k(FP_j)/S_k(FP_i)) \geq 1.5.$$

8. The method of claim 7, wherein the imaging specification $S_k$ is described by an odd-order Zernike coefficient or a linear combination of odd-order Zernike coefficients.

9. The method of claim 1, wherein:
   the imaging specification data comprise at least one structure data selected from the group consisting of core region structure orientation data, core region structure position data, peripheral structure orientation data, and peripheral structure position data;
   the at least one structure data is such that at least one of the following holds:
      there are two field points whose imaging specification data differ in at least one aspect; and there is one field point at which the wavefront specification for a wavefront for an $n^{th}$-order wavefront expansion function differs in at least one aspect from the wavefront rotated by an angle of 90°/n.

10. The method of claim 1, further comprising:
determining at least one subset of use case data and/or imaging specification data for a use case via an extrinsic data acquisition;
communicating the at least one subset of use case data and/or imaging specification data to the control unit of the projection lens,
wherein:
acquiring the extrinsic data comprises at least one measure from the group consisting of:
interrogation by the user via a user interface;
retrieval from a memory accessible to a control unit of the projection exposure apparatus;
determination from information concerning settings on the illumination system of the projection exposure apparatus; and
determination from information about the mask to be exposed.

11. The method of claim 1, further comprising determining at least one subset of use case data for a use case via intrinsic data acquisition by at least one measurement on or in the projection lens, and communicating the at least one subject of use case data for the use case to the control unit of the projection lens.

12. The method of claim 1, wherein determining use case data comprises automatedly determining projection radiation data representing at least one property of the projection radiation passing from an object plane of the projection lens in a direction of an image plane of the projection lens.

13. The method of claim 12, wherein determining projection radiation data comprises measuring a wavefront of the projection radiation at at least one field point.

14. The method of claim 1, wherein:
use case classification data are stored in a memory accessible to a control unit of the projection exposure apparatus;
the use case classification data comprises, for a multiplicity of combinations of an illumination setting and a mask structure in the illumination region, corresponding intensity distribution data for at least one reference surface lying between the object plane and the image plane; and
projection radiation data are determined using the use case classification data.

15. The method of claim 1, wherein a pattern recognition method and/or a feature extraction method are/is used when determining pattern data and/or illumination setting data from the projection radiation data.

16. The method of claim 1, further comprising comparing first use case data of a first projection exposure with second use case data of a directly succeeding second projection exposure to generate use case comparison data.

17. The method of claim 16, further comprising generating a use case change signal indicating the change of the use case in a manner dependent on the use case comparison data.

18. A method of using a projection exposure apparatus comprising an illumination system and a projection lens, the method comprising:
illuminating an illumination region of a pattern with illumination radiation provided by the illumination system in accordance with an illumination setting specific to a use case, the illumination setting being characterized by illumination setting data and imaging-relevant properties of the pattern being characterized by pattern data;
determining use case data specific to the use case, the use case data comprising pattern data and/or illumination setting data;
using the use case data to determine imaging specification data;
controlling optical components of the projection lens based on the imaging specification data to adapt imaging behavior of the projection lens to the use case; and
using the projection lens adapted to the use case to image the pattern onto a substrate,
wherein:
determining use case data comprises automatedly determining projection radiation data representing at least one property of the projection radiation passing from an object plane of the projection lens in a direction of an image plane of the projection lens;
determining projection radiation data comprises determining intensity distribution data representing a two-dimensional distribution of radiation intensity of the projection radiation at at least one reference surface lying between the object plane and the image plane in a projection beam path; and
for determining intensity distribution data, a two-dimensional temperature distribution at the reference surface is measured in a spatially resolved manner.

19. The method of claim 18, wherein at least one optical surface of an optical element in the beam path of the projection lens is used as reference surface.

20. The method of claim 19, wherein the optical element is a mirror, and the optical surface is a mirror surface.

21. The method of claim 18, further comprising acquiring the two-dimensional temperature via at least one thermal imaging camera or at least one temperature sensor.

22. The method of claim 18, further comprising determining intensity distribution data at a reference surface which lies at or in proximity to a pupil plane of the projection lens, and using the intensity distribution data to determine illumination setting data.

23. A method of using a projection exposure apparatus comprising an illumination system and a projection lens, the method comprising:
illuminating an illumination region of a pattern with illumination radiation provided by the illumination system in accordance with an illumination setting specific to a use case, the illumination setting being characterized by illumination setting data and imaging-relevant properties of the pattern being characterized by pattern data;
determining use case data specific to the use case, the use case data comprising pattern data and/or illumination setting data;
using the use case data to determine imaging specification data;
controlling optical components of the projection lens based on the imaging specification data to adapt imaging behavior of the projection lens to the use case; and
using the projection lens adapted to the use case to image the pattern onto a substrate,
wherein:
determining use case data comprises automatedly determining projection radiation data representing at least one property of the projection radiation passing from an object plane of the projection lens in a direction of an image plane of the projection lens;

determining projection radiation data comprises determining intensity distribution data representing a two-dimensional distribution of radiation intensity of the projection radiation at at least one reference surface lying between the object plane and the image plane in a projection beam path; and the method further comprises determining intensity distribution data at a reference surface which lies at or in proximity to a field plane of the projection lens, and using the intensity distribution data to determine pattern data.

24. The method of claim 23, wherein at least one optical surface of an optical element in the beam path of the projection lens is used as reference surface.

25. The method of claim 24, wherein the optical element is a mirror, and the optical surface is a mirror surface.

26. A method of using a projection exposure apparatus comprising an illumination system and a projection lens, the method comprising:

illuminating an illumination region of a pattern with illumination radiation provided by the illumination system in accordance with an illumination setting specific to a use case, the illumination setting being characterized by illumination setting data and imaging-relevant properties of the pattern being characterized by pattern data;

determining use case data specific to the use case, the use case data comprising pattern data and/or illumination setting data;

using the use case data to determine imaging specification data;

controlling optical components of the projection lens based on the imaging specification data to adapt imaging behavior of the projection lens to the use case; and using the projection lens adapted to the use case to image the pattern onto a substrate, wherein:

determining use case data comprises automatedly determining projection radiation data representing at least one property of the projection radiation passing from an object plane of the projection lens in a direction of an image plane of the projection lens;

determining projection radiation data comprises determining intensity distribution data representing a two-dimensional distribution of radiation intensity of the projection radiation at at least one reference surface lying between the object plane and the image plane in a projection beam path;

a first reference surface is arranged at or in proximity to a pupil plane of the projection lens;

a second reference surface is arranged at or in proximity to a field plane of the projection lens; and the method further comprises:

determining first intensity distribution data at the first reference surface;

determining second intensity distribution data at the second reference surface; and using the first and the second intensity distribution data to determine the pattern data and/or illumination setting data.

27. The method of claim 26, wherein at least one optical surface of an optical element in the beam path of the projection lens is used as reference surface.

28. The method of claim 27, wherein the optical element is a mirror, and the optical surface is a mirror surface.

29. An apparatus, comprising:

an illumination system configured to generate an illumination radiation directed onto a mask;

a projection lens configured to generate an image of a pattern in a region of an image plane of the projection lens; and a system configured to adapt imaging behavior of the projection lens to a specific use case, the system comprising:

units configured to determine use case data specific to the use case;

units configured to determine imaging specification data using the use case data; and a control unit assigned to the projection lens and configured to control optical components of the projection lens based on the imaging specification data to adapt the imaging behavior of the projection lens to the use case, wherein the apparatus is a projection exposure apparatus, wherein the units configured to determine use case data comprise an intrinsic data acquisition system which comprises a unit configured to acquire intrinsic data which is connected to at least one measuring and acquiring unit selected from the group consisting of:

a wavefront measuring system configure dot measure a wavefront of projection radiation passing in the projection lens from the mask to a substrate to be exposed;

a reticle measuring system configured to measure structures of the pattern of the mask; and a unit configured to determine intensity distribution data representing a two-dimensional distribution of radiation intensity of the projection radiation at at least one reference surface lying between an object plane of the projection lens and an image plane of the projection lens in a projection beam path; and wherein the unit configured to determine intensity distribution data comprises at least one element selected from the group consisting of:

temperature measuring system configured to: i) acquire local temperatures in an illuminated region in a spatially resolved manner at an optical surface of an optical element that serves as reference surface; and ii) determine therefrom a two-dimensional temperature distribution at the optical surface; and a thermal imaging camera configured to spatially resolve recording of a two-dimensional heat distribution at an optical surface of an optical element of the projection lens.

30. The apparatus of claim 29, wherein the optical element having the optical surface comprises a mirror.

31. The apparatus of claim 29, wherein the system for intrinsic data acquisition comprises:

a first unit configured to determine first intensity distribution data at a first reference surface lying at or in proximity to a pupil plane of the projection lens; and a second unit configured to determine second intensity distribution data at a second reference surface lying at or in proximity to a field plane of the projection lens.

32. The apparatus of claim 31, wherein a subaperture ratio is in the range of 0.7 to 1 at the first reference surface, and a subaperture ratio is in the range of 0 to 0.3 at the second reference surface.

33. The apparatus of claim 29, wherein the units configured to determine use case data comprise a system to acquire extrinsic data which comprises a unit to acquire extrinsic data, which is connected to at least one unit selected from the group consisting of:
- a user interface with a computer terminal configured to allow a user to input data;
- a memory to the control unit and in which is stored at least one portion of the use case data in the form of information about the illumination system, the projection lens and/or the reticle;
- a data line by which information concerning settings on the illumination system of the projection exposure apparatus is retrievable; and
- a reticle data acquisition unit configured to read in information concerning the reticle.

34. The apparatus of claim 29, wherein a controllable optical component of the projection lens is a mirror arranged at or in proximity to a pupil surface and to which is assigned a deformation manipulator comprising a multiplicity of independently driveable actuators which allow the mirror surface of the mirror to be deformed one-dimensionally or two-dimensionally.

* * * * *

UNITED STATES PATENT AND TRADEMARK OFFICE
CERTIFICATE OF CORRECTION

| | |
|---|---|
| PATENT NO. | : 9,817,316 B2 |
| APPLICATION NO. | : 15/083622 |
| DATED | : November 14, 2017 |
| INVENTOR(S) | : Boris Bittner et al. |

It is certified that error appears in the above-identified patent and that said Letters Patent is hereby corrected as shown below:

In the Specification

Column 1, Line 62, delete "a" and insert -- σ --.

Column 6, add Lines 55-59 to the paragraph on Line 54.

Column 6, Line 56, delete "nth order" and insert -- nth-order --.

Column 11, Line 25, delete "FIG. 4A-4E, FIG. 5A-5I to FIG. 6A-6I" and insert -- FIGS. 4A-4E, FIGS. 5A-5I to FIGS. 6A-6I --.

Column 18, Line 26, delete "FIG." and insert -- FIGS. --.

Signed and Sealed this
Thirteenth Day of March, 2018

Andrei Iancu
*Director of the United States Patent and Trademark Office*